(12) United States Patent
Ma

(10) Patent No.: US 10,971,636 B2
(45) Date of Patent: Apr. 6, 2021

(54) PHOTOELECTRIC DETECTION STRUCTURE, MANUFACTURING METHOD THEREFOR, AND PHOTOELECTRIC DETECTOR

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 16/329,405

(22) PCT Filed: Jun. 8, 2018

(86) PCT No.: PCT/CN2018/090360
§ 371 (c)(1),
(2) Date: Feb. 28, 2019

(87) PCT Pub. No.: WO2018/228277
PCT Pub. Date: Dec. 20, 2018

(65) Prior Publication Data
US 2019/0198688 A1 Jun. 27, 2019

(30) Foreign Application Priority Data
Jun. 12, 2017 (CN) .......................... 201710438883.8

(51) Int. Cl.
*H01L 31/0224* (2006.01)
*H01L 31/18* (2006.01)
(Continued)

(52) U.S. Cl.
CPC ................ *H01L 31/022408* (2013.01); *H01L 31/03529* (2013.01); *H01L 31/035272* (2013.01);
(Continued)

(58) Field of Classification Search
CPC ....... H01L 27/146–14893; H01L 29/47; H01L 29/475; H01L 29/872; H01L 29/66212;
(Continued)

(56) References Cited

U.S. PATENT DOCUMENTS 3,651,349 A * 3/1972 Kahng .............. H01L 29/76875
327/564
3,924,319 A * 12/1975 Mohsen .......... H01L 21/823406
438/144
(Continued)

FOREIGN PATENT DOCUMENTS

| CN | 1595200 A | 3/2005 |
| CN | 101246894 A | 8/2008 |

(Continued)

OTHER PUBLICATIONS

International Search Report of PCT/CN2018/090360 in Chinese, dated Sep. 19, 2018, with English translation.
(Continued)

*Primary Examiner* — Eric A. Ward
(74) *Attorney, Agent, or Firm* — Collard & Roe, P.C.

(57) ABSTRACT

A photoelectric detection structure, a manufacturing method therefor, and a photoelectric detector. The photoelectric detection structure includes: a base substrate; an electrode strip, which is located on the base substrate; a semiconductor layer, which is located at a side of the base substrate that faces the electrode strip; an insulating layer, which is located between the electrode strip and the semiconductor layer, the insulating layer including a thickness-increased portion, and the thickness-increased portion being located on at least one edge of the electrode strip.

16 Claims, 2 Drawing Sheets

(51) Int. Cl.
*H01L 31/108* (2006.01)
*H01L 31/0352* (2006.01)
*H01L 31/20* (2006.01)

(52) U.S. Cl.
CPC ...... *H01L 31/1085* (2013.01); *H01L 31/1808* (2013.01); *H01L 31/202* (2013.01); *Y02P 70/50* (2015.11)

(58) Field of Classification Search
CPC . H01L 29/66143; H01L 31/062; H01L 31/07; H01L 31/108; H01L 31/1085; H01L 27/148–14893
See application file for complete search history.

(56) References Cited

U.S. PATENT DOCUMENTS

| | | | | |
|---|---|---|---|---|
| 4,000,502 | A * | 12/1976 | Butler | H01L 31/02164 257/453 |
| 4,347,656 | A * | 9/1982 | Smith | G11C 19/282 257/248 |
| 6,236,074 | B1 * | 5/2001 | Choi | H01L 27/14683 257/214 |
| 7,061,030 | B2 * | 6/2006 | Tanaka | H01L 27/14689 257/215 |
| 2005/0051731 | A1 | 3/2005 | Sato et al. | |
| 2005/0145969 | A1 * | 7/2005 | Gulden | H01L 31/1852 257/449 |
| 2007/0113886 | A1 * | 5/2007 | Arao | H01L 27/14609 136/256 |
| 2007/0235829 | A1 * | 10/2007 | Levine | H01L 27/1464 257/437 |
| 2011/0057282 | A1 * | 3/2011 | Ellis-Monaghan | H01L 27/14607 257/443 |
| 2012/0256286 | A1 * | 10/2012 | Kusumoto | H01L 31/147 257/459 |
| 2015/0137301 | A1 * | 5/2015 | Yoneta | H01L 27/1464 257/443 |
| 2016/0254392 | A1 * | 9/2016 | Hasegawa | H01L 21/28537 257/77 |
| 2019/0198688 | A1 | 6/2019 | Ma | |

FOREIGN PATENT DOCUMENTS

| | | |
|---|---|---|
| CN | 101313413 A | 11/2008 |
| CN | 107170842 A | 9/2017 |
| JP | S63147361 A | 6/1988 |

OTHER PUBLICATIONS

Notice of Transmittal of the International Search Report of PCT/CN2018/090360 in Chinese, dated Sep. 19, 2018.

Written Opinion of the International Searching Authority of PCT/CN2018/090360 in Chinese, dated Sep. 19, 2018 with English translation.

* cited by examiner

PHOTOELECTRIC DETECTION STRUCTURE, MANUFACTURING METHOD THEREFOR, AND PHOTOELECTRIC DETECTOR

CROSS-REFERENCE TO RELATED APPLICATION

This application is the National Stage of PCT/CN2018/090360 filed on Jun. 8, 2018, which claims priority under 35 U.S.C. § 119 of Chinese Application No. 201710438883.8 filed on Jun. 12, 2017, the disclosure of which is incorporated by reference.

TECHNICAL FIELD

At least one embodiment of the present disclosure relates to a photoelectric detection structure, a manufacturing method thereof, and a photoelectric detector.

BACKGROUND

Metal-Semiconductor-Metal (MSM) photoelectric detectors are widely applied in the field of optical fiber communication because of their advantages such as fast response, small capacitance, simple process and easy integration etc. How to make a MSM photoelectric detector with good performance has also received extensive attention.

SUMMARY

At least one embodiment of the present disclosure provides a photoelectric detection structure, a manufacturing method thereof, and a photoelectric detector.

At least one embodiment of the present disclosure provides a photoelectric detection structure comprising a base substrate; an electrode strip on the base substrate; a semiconductor layer on a side of the base substrate facing the electrode strip; an insulating layer between the electrode strip and the semiconductor layer. The insulating layer comprises a thickness increasing portion, which is located on at least one edge of the electrode strip.

In an example of the present disclosure, the semiconductor layer is located on a side of the electrode strip away from the base substrate.

In an example of the present disclosure, a portion of the insulating layer other than the thickness increasing portion is located on a portion between edges of the electrode strip and in a region of the base substrate where the electrode strip is not provided, and a ratio of a thickness of the thickness increasing portion to a thickness of the portion of the insulating layer other than the thickness increasing portion is in a range of 1.5:1 to 3:1.

In an example of the present disclosure, the electrode strip comprises a plurality of first sub-electrode strips and a plurality of second sub-electrode strips extending in a first direction and alternately arranged in a second direction, the plurality of first sub-electrode strips and the plurality of second sub-electrode strips are configured to apply different voltages to form a potential difference between adjacent ones of the plurality of first sub-electrode strips and the plurality of second sub-electrode strips, and the first direction and the second direction cross each other.

In an example of the present disclosure, the thickness increasing portion is located on an edge of at least one of the plurality of first sub-electrode strips and the plurality of second sub-electrode strips facing the other.

In an example of the present disclosure, a material of the insulating layer comprises a photoresist material.

In an example of the present disclosure, the insulating layer comprises a first insulating layer and a second insulating layer, and the second insulating layer is located on the at least one edge of the electrode strip, to form the thickness increasing portion.

In an example of the present disclosure, a pattern of the electrode strip comprises an interdigital electrode pattern.

At least one embodiment of the present disclosure provides a manufacturing method of a photoelectric detection structure, comprising: providing a base substrate; and forming an electrode strip, an insulating layer, and a semiconductor layer on a side of the base substrate. The insulating layer is formed between the electrode strip and the semiconductor layer, the insulating layer comprises a thickness increasing portion which is located on at least one edge of the electrode strip.

In an example of the present disclosure, forming the electrode strip, the insulating layer, and the semiconductor layer on the side of the base substrate comprises: forming the electrode strip on the base substrate; forming the insulating layer on a side of the electrode strip away from the base substrate; and forming the semiconductor layer on a side of the insulating layer away from the electrode strip.

In an example of the present disclosure, a material of the insulating layer comprises a photoresist material, and the insulating layer is formed by one time patterning with a halftone mask process.

In an example of the present disclosure, the insulating layer comprises a first insulating layer and a second insulating layer, and forming the insulating layer comprises: forming the first insulating layer and the second insulating layer on the electrode strip, wherein the second insulating layer is formed on the at least one edge of the electrode strip to form the thickness increasing portion.

At least one embodiment of the present disclosure provides a photoelectric detector, comprising the photoelectric detection structure provided by any one of the embodiments of the present disclosure.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," or "include," etc. are intended to specify that the elements or the objects stated before these terms encompass the elements or the objects and equivalents thereof listed after these terms, but do not preclude the other elements or objects. "On," "under," and the like are only used to indicate relative position relationship, and when the position of the object which is described is changed, the relative position relationship can be changed accordingly.

Figure 1A:
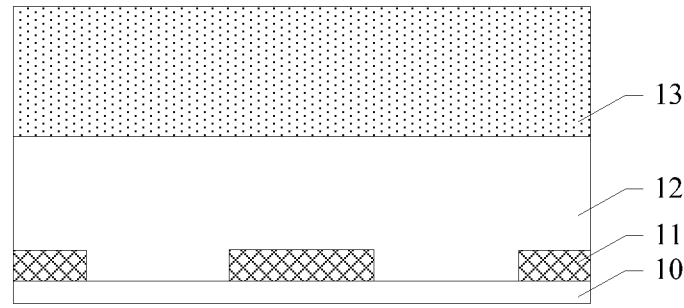
FIG. 1A is a partial cross-sectional view of an MSM photoelectric detection structure.

In the study, the inventor of the present application found that in the metal-semiconductor-metal (MSM) photoelectric detection structure, because the electric field intensity at the metal electrode is greater than that of other regions, upon the metal electrode width being small, regions having a large electric field generated at two edges of the metal electrode will coincide, thereby increasing the dark current. FIG. 1A is a partial cross-sectional view of an MSM photoelectric detection structure. As shown in FIG. 1A, the MSM photoelectric detection structure comprises a base substrate 10, a metal electrode strip 11 located on the base substrate 10, and an insulating layer 12 covering the metal electrode strip 11 and a semiconductor layer 13 located on the insulating layer 12. Here, a size of the metal electrode strip 11 in a direction perpendicular to the base substrate 10 is about 100 nm, a size of the insulating layer 12 in the direction perpendicular to the base substrate 10 is about 450 nm, and a size of the semiconductor layer 13 in the direction perpendicular to the base substrate is about 400 nm. A material of the metal electrode strip 11 comprises aluminum, a material of the insulating layer 12 comprises polyimide (PI), and a material of the semiconductor layer 13 comprises amorphous silicon (a-Si). A Schottky barrier is formed between the semiconductor layer 13 and the metal electrode strip 11. When light with a suitable wavelength is incident, valence band electrons in the semiconductor layer 13 absorb photon energy and transit to a conduction band, and the concentration of electrons in the conduction band and the concentration of holes in a valence band increase to generate photo electrons-hole pairs between the conduction band and the valence band. The generated photo-generated electron-hole pairs are subjected to directional motion such as drift or diffusion etc. under the action of the applied bias voltage (or built-in electric field), and a photo-generated current is formed after being trapped by the metal electrode strip 11.

Figure 1B:
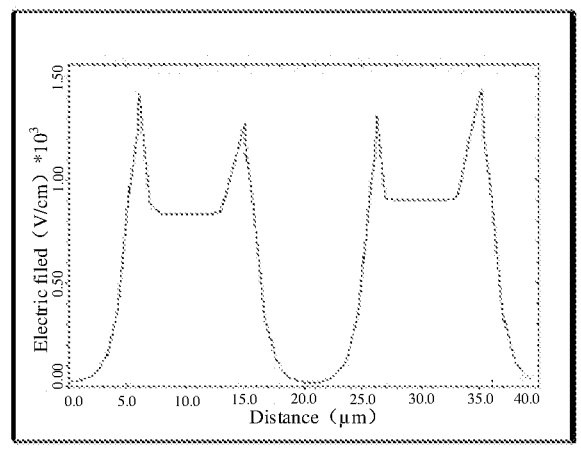
FIG. 1B is a schematic diagram of electric field distribution of the MSM photoelectric detection structure shown in FIG. 1A.

FIG. 1B is a schematic diagram of electric field distribution of the MSM photoelectric detection structure shown in FIG. 1A. As shown in FIG. 1B, the electric field intensity at the edges of the metal electrode strip 11 is large, and the electric field at the edges of the metal electrode strip 11 corresponds to a peak of the electric field distribution in the figure; the electric field intensity at a position between two adjacent metal electrode strips 11 is smaller than the electric field intensity at the edges of the metal electrode strip 11, that is, the electric field intensity at the position between the adjacent two metal electrode strips 11 corresponds to the flatness between the two peaks in the figure; the electric field intensity at a center of each metal electrode strip 11 is very small, and the electric field intensity at the center of each metal electrode strip 11 corresponds to the depression in the electric field distribution as shown in the figure. Therefore, a width of the metal electrode strip of the MSM photoelectric detection structure cannot be designed too small, and a wider metal electrode strip affects the fill factor of the MSM photoelectric detector device, which reduces the photoconversion effective area of the device as a whole.

At least one embodiment of the present disclosure provides a photoelectric detection structure, a manufacturing method thereof, and a photoelectric detector. The photoelectric detection structure comprises a base substrate, an electrode strip on the base substrate, a semiconductor layer on a side of the base substrate facing the electrode strip, and an insulating layer between the electrode strip and the semiconductor layer. The insulating layer comprises a thickness increasing portion which is located on at least one edge of the electrode strip. The photoelectric detection structure can reduce the electric field intensity in the semiconductor photoelectric conversion layer corresponding to the edge of the electrode strip, and on the one hand, the dark current is reduced, and on the other hand, the performance of the photoelectric detector can be improved by reducing a width of the electrode strip.

The photoelectric detection structure, the manufacturing method thereof and the photoelectric detector provided by the embodiments of the present disclosure are described below with reference to the accompanying drawings.

Figure 2A:
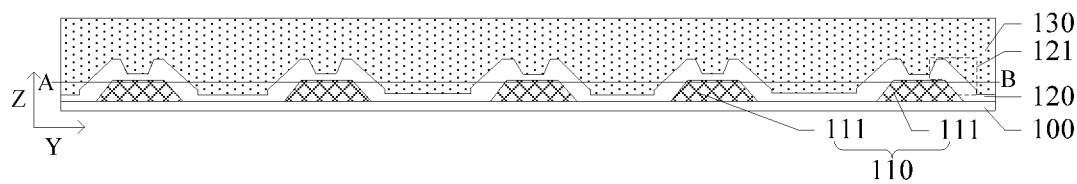
FIG. 2A is a partial cross-sectional view of a photoelectric detection structure according to an example of an embodiment of the present disclosure.

An embodiment of the present disclosure provides a photoelectric detection structure. FIG. 2A is a cross-sectional view of a photoelectric detection structure according to an example of the present embodiment. As shown in FIG. 2A, the photoelectric detection structure comprises a base substrate 100, an electrode strip 110 located on the base substrate 100, a semiconductor layer 130 located on a side of the base substrate 100 facing the electrode strip 110, and an insulating layer 120 located between the electrode strip 110 and the semiconductor layer 130. The insulating layer 120 comprises a thickness increasing portion 121 (as shown in a broken line frame in FIG. 2A). The embodiment illustrates an example in which the thickness increasing portion 121 is only at least one edge of the electrode strip 110, but it is not limited to this. A film layer of a portion of the insulating layer 120 other than the thickness increasing portion 121 is located on a portion of the electrode strip 110 between the edges of the electrode strip 110 and in a region of the base substrate 100 where the electrode strip 110 is not provided. A thickness of the thickness increasing portion 121 is larger than a thickness of the portion of the insulating layer 120 other than the thickness increasing portion 121, and a thickness of the insulating layer 120 except the thickness increasing portion 121 is the same. It should be noted that the cross-sectional pattern of the electrode strip 110 produced by an actual process which is perpendicular to a longitudinal direction of the electrode strip is approximately trapezoidal, and the "edge" of the at least one edge of the electrode strip 110 can refer to a position of a waist (side) of the electrode strip 110. Therefore, the thickness increasing portion 121 is located on the position of the waist of the electrode strip 110, such that the edge of the electrode strip 110 is wrapped by the thickness increasing portion 121, that is, "the thickness increasing portion 121 is located on the edge" refers to that the thickness increasing portion 121 at least covers a side surface of the electrode strip 110 and a surface parallel to the base substrate of a portion of the electrode strip 10 which is connected to the side surface of the electrode strip 110. In addition, the "thickness of the thickness increasing portion 121" herein refers to a thickness of the insulating layer 120 extending in a direction perpendicular to the surface parallel to the base substrate or the side surface of the electrode strip 110, "the thickness of the portion of the insulating layer 120 other than the thickness increasing portion 121" refers to a size of the insulating layer 120 in a direction perpendicular to the base substrate 100.

In a design provided by the embodiment for improving the thickness of the insulating layer on the edge of the electrode strip, a distance between the electrodes is increased by increasing only the thickness of the insulating layer on the edge of the electrode strip, thereby reducing the electric field intensity in the semiconductor layer corresponding to the edge of the electrode strip, so that the planar electric field of the entire photoelectric detection structure is substantially the same (eliminating a peak electric field at the edge of the electrode strip of a typical MSM photoelectric detection structure). The design for improving the thickness of the insulating layer provided by the embodiment on the one hand reduces the dark current, and on the other hand improves the fill factor of the photoelectric detector by reducing the width of the electrode strip, thereby improving the performance of the photoelectric detector device.

For example, a material of the base substrate 100 can be made of one or more of glass, polyimide, polycarbonate, polyacrylate, polyetherimide, polyethersulfone, and the embodiment comprises but is not limit to this.

For example, as shown in FIG. 2A, the semiconductor layer 130 is located on a side of the electrode strip 110 away from the base substrate 100, and the embodiment comprises but is not limited to this. For example, the semiconductor layer 130 can also be located on a side of the electrode strip 110 close to the substrate 100. This embodiment describes an example in which the semiconductor layer 130 is located on the side of the electrode strip 110 away from the base substrate 100.

For example, a material of the semiconductor layer 130 can be selected from materials such as silicon and germanium etc., and the embodiment comprises but is not limited to this. When light with a suitable wavelength is irradiated on the semiconductor layer 130, valence band electrons of the semiconductor layer 130 absorb photon energy and transit to a conduction band, and the electron concentration of the conduction band and the hole concentration of a valence band increase to generate photo-generated electron-hole pairs between the conduction band and the valence band.

For example, a material of the insulating layer 120 can comprise a photoresist material, for example, polyimide or the like, and the embodiment comprises but is not limited to this. For example, the material of the insulating layer 120 can also comprise silicon dioxide, silicon nitride, or the like. The insulating layer 120 between the electrode strip 110 and the semiconductor layer 130 can serve as a barrier layer for increasing the Schottky barrier height to reduce the dark current and the like of the photoelectric detection structure.

For example, as shown in FIG. 2A, the insulating layer 120 is an integral film layer covering the electrode strip 110, and the thickness of the film layer of the portion of the insulating layer 120 other than the thickness increasing portion 121 can be 300 nm to 500 nm, for example, 450 nm, and the embodiment comprises but is not limited to this. For example, the ratio of the thickness of the thickness increasing portion 121 to the thickness of the portion of the insulating layer 120 other than the thickness increasing portion 121 is in a range of 1.5:1 to 3:1, and the embodiment comprises but is not limited to this.

It should be noted that, in the example, the thickness increasing portion 121 of the insulating layer 120 and the portion of the insulating layer 120 other than the thickness increasing portion 121 are formed by one time patterning, so that the process steps can be saved.

Figure 2B:
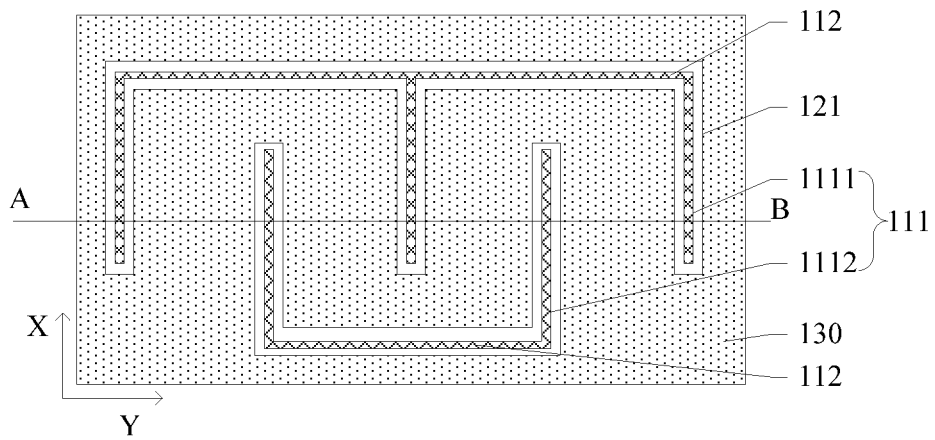
FIG. 2B is a planar view of the photoelectric detection structure shown in FIG. 2A in AB direction.

For example, FIG. 2B is a planar view of the photoelectric detection structure shown in FIG. 2A along line AB. FIG. 2B schematically shows only a pattern with several electrode strips, a number of which is not limited here, and is determined depending on the actual process. As shown in FIGS. 2A and 2B, the electrode strip 110 comprises a plurality of sub-electrode strips 111 extending in a first direction and arranged in a second direction, the first direction and the second direction cross each other. The first direction of the embodiment refers to the X direction in FIG. 2B, and the second direction of the embodiment refers to the Y direction in FIG. 2B. The embodiment describes an example in which the first direction is perpendicular to the second direction but it is not limited to this, and the first direction can be not perpendicular to the second direction.

For example, as shown in FIG. 2B, the electrode strip 110 of the embodiment further comprises two sub-electrode strip connecting portions 112 extending in the Y direction for electrically connecting the two sub-electrode strips 111 respectively, that is, the embodiment describes an example in which a pattern of the electrode strip 110 is an interdigital electrode as shown in FIG. 2B. The interdigital electrode refers to an electrode having a periodic pattern in a finger or comb-like plane. The interdigital electrode is often applied in the photoelectric detection structure. The ratio of a length and a width of the interdigital fingers and a number of the interdigital fingers directly affect the sensitivity and response speed of the photoelectric detector. Generally, optimizing related parameters of the interdigital electrodes can improve the performance of the photoelectric detector. For example, a gap between the interdigital fingers can affect the number of photo-generated carriers. The larger the gap, the more the number of photo-generated carriers. However, if the gap between the interdigital fingers is too large, the transit time of the photo-generated carriers becomes longer and the loss becomes more, which reduces the response speed of the detector. Therefore, the size of the interdigital electrode is designed to fully take into account the structural parameters of the interdigital electrode and the generation and transition of photo-generated carriers. The pattern of the electrode strip of the embodiment is not limited to the interdigital electrode pattern. For example, the electrode strip can further comprise two sub-electrode strips extending in the first direction and arranged in the second direction, and the two sub-electrode strips are respectively applied with different voltages, so that a certain potential difference is formed between them.

For example, as shown in FIGS. 2A and 2B, the thickness increasing portion 121 is located on two edges of each of the sub-electrode strips 111 extending in the first direction, that is, the thickness increasing portion 121 is located on a position of two waists of each of the sub-electrode strips 111 extending in the X direction, to wrap the edges of each of the sub-electrode strips 111, and the embodiment comprises but is not limited to this. For example, the thickness increasing portion 121 can also be located on at least one edge of the two sub-electrode strip connecting portions 112 extending in the Y direction and electrically connecting the two sub-electrode strips 111 respectively, to wrap the at least one edge of the sub-electrode strip connecting portion 112. For example, the thickness increasing portion 121 can also be located on a narrow edge of each of the sub-electrode strips 111 extending in the Y direction, and the like, and the embodiment comprises but is not limited to this. In the embodiment, the thickness of the insulating layer 120 on any edge of the electrode strip 110 is increased to wrap any edge of the electrode strip 110, and a distance between adjacent electrode strips 110 can be increased to lower the electric field intensity in the semiconductor layer corresponding to the edge of the electrode strip 110, which can reduce the dark current of the photoelectric detection structure on the one hand, and increase the fill factor of the photoelectric detector by reducing the width of the electrode strip on the other hand, thereby improving the performance of the photoelectric detector device.

For example, as shown in FIG. 2B, the plurality of sub-electrode strips 111 comprise a plurality of first sub-electrode strips 1111 and a plurality of second sub-electrode strips 1112 that are alternately disposed. The plurality of first sub-electrode strips 1111 are electrically connected to one sub-electrode strip connecting portion 112 extending in the Y direction, and the plurality of second sub-electrode strips 1112 are electrically connected to the other sub-electrode strip connecting portion 112 extending in the Y direction. Upon an external bias being applied to the electrode strip 110, the plurality of first sub-electrode strips 1111 have the same electric potential, and the plurality of second sub-electrode strips 1112 have the same electric potential, and a certain potential difference is formed between the first sub-electrode strip 1111 and the second sub-electrode 1112 adjacent to each other, so that the photo-generated electron-hole pairs generated by the semiconductor layer 130 are separated into two kinds of carriers, electrons and holes, under the electric field formed between the first sub-electrode strip 1111 and the second sub-electrode strip 1112, and the two kinds of carriers are respectively captured by the first sub-electrode strip 1111 and the second sub-electrode strip 1112 by a motion such as drift or diffusion to form a photo-generated current. Here, the function of the electrode strip 110 is to provide an electric field for the photo-generated electron-hole pairs generated by the semiconductor layer 130 to facilitate the directional movement of the carriers and collect the carriers to form the photo-generated current.

For example, the thickness of the electrode strip 110 in the Z direction can be 50 nm to 100 nm, and the embodiment comprises but is not limited to this.

For example, the width of the sub-electrode strip 111 in the Y direction can be 3-10 μm, and the embodiment comprises but is not limited to this.

For example, the distance between the first sub-electrode strip 1111 and the second sub-electrode strip 1112 adjacent to each other in the Y direction is 5-15 μm, and the embodiment comprises but is not limited to this.

For example, the material of the electrode strip 110 comprises at least one selected from the group consisting of tungsten, chromium, titanium, platinum, gold, silver, palladium, and iron etc., and the embodiment comprises but is not limited to this.

Figure 3:
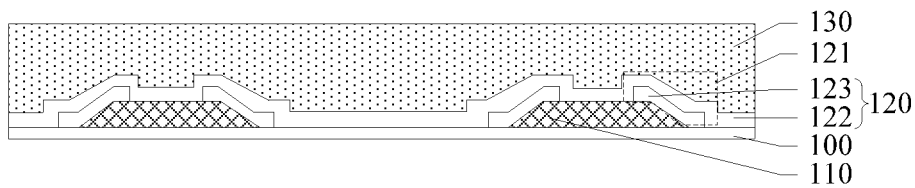
FIG. 3 is a partial cross-sectional view of a photoelectric detection structure according to another example of the embodiment of the present disclosure.

For example, FIG. 3 is a schematic cross-sectional view of a photoelectric detection structure provided by another example of the embodiment, and the example only schematically shows a case of two electrode strips. As shown in FIG. 3, the photoelectric detection structure provided in this example is different from the photoelectric detection structure provided in FIG. 2A in that: the insulating layer 120 of the photoelectric detection structure comprises a first insulating layer 122 and a second insulating layer 123, and the first insulating layer 122 and the second insulating layer 123 are respectively patterned by different materials. The second insulating layer 123 provided by the present example is located on at least one edge of the electrode strip 110 to form a thickness increasing portion 121. Here, the first insulating layer 122 is an integral film layer covering the electrode strip 110, and the second insulating layer 123 corresponds to the position of the thickness increasing portion 121 of the insulating layer 120 in FIG. 2A, that is, the second insulating layer 123 located on the at least one edge of the electrode strip 110 forms a thickness increasing portion 121 together with the first insulating layer 122. The second insulating layer 123 of the present example can be located on the positions of the two waists of each of the sub-electrode strips 111 extending in the X direction, as shown in FIG. 2B, to wrap the edges of each of the sub-electrode strips 111; and can also be located on at least one edge of the two sub-electrode strip connecting portions 112 extending in the Y direction and electrically connecting the two sub-electrode strips 111 respectively, to wrap the at least one edge of the sub-electrode strip connecting portion 112; and can further be located on a narrow edge of each sub-electrode strip 111 extending in the Y direction, etc., and this is not limited in the embodiment. The second insulating layer provided by the present example can increase the distance between adjacent electrodes, thereby reducing the electric field intensity in the semiconductor layer corresponding to the edge of the electrode strip.

For example, as shown in FIG. 3, the present example describes an example for in which the second insulating layer 123 is located between the first insulating layer 122 and the electrode strip 110, but it is not limited to this. For example, the second insulating layer 123 can also be located on a side of the first insulating layer 122 away from the electrode strip 110, as long as the second insulating layer 123 can increase a distance between the edge of the electrode strip 110 and the semiconductor layer 120.

Figure 4:
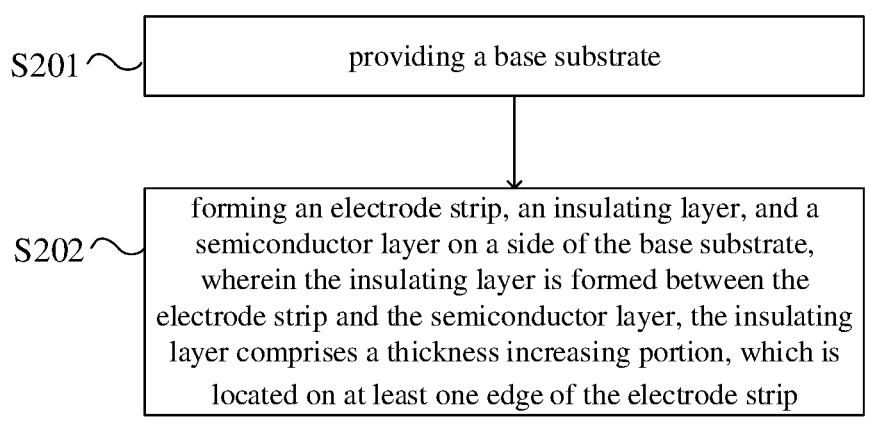
FIG. 4 is a schematic flowchart of a manufacturing method of a photoelectric detection structure according to an embodiment of the present disclosure.

Another embodiment of the present disclosure provides a manufacturing method of a photoelectric detection structure. FIG. 4 is a schematic flowchart of a manufacturing method of a photoelectric detection structure according to the present embodiment. As shown in FIG. 4, the method comprises:

S201: providing a base substrate.

For example, a material of the base substrate can be made of one or more of glass, polyimide, polycarbonate, polyacrylate, polyetherimide, polyethersulfone, etc. and the embodiment comprises but is not limited to this.

S202: forming an electrode strip, an insulating layer, and a semiconductor layer on a side of the base substrate, wherein the insulating layer is formed between the electrode strip and the semiconductor layer, the insulating layer comprises a thickness increasing portion, which is located on at least one edge of the electrode strip.

For example, a metal electrode layer is formed on the base substrate by sputtering or evaporation, and then a desired electrode strip is formed by a mask patterning process, that is, a thin and uniform photoresist layer can be applied by a spin coating method on the metal electrode layer, and the photoresist layer is irradiated with an electron beam, an ion beam, X-ray or ultraviolet light, etc. by using a mask plate, to expose the photoresist layer. After exposure, the photoresist layer is developed by an alkaline developer, to form a photoresist mask pattern. Using the photoresist mask pattern as a mask, the metal electrode layer is etched to form a pattern of the electrode strip, and finally the photoresist layer is stripped.

It should be noted that the cross-sectional pattern of the electrode strip manufactured in the actual process in a direction perpendicular to its length is approximately trapezoidal as shown in FIG. 2A.

For example, the pattern of the formed electrode strip is as shown in FIGS. 2A and 2B, and the electrode strip 110 comprises a plurality of sub-electrode strips 111 extending in the first direction and arranged in the second direction, the first direction and the second direction cross each other. The embodiment describes an example in which the first direction is perpendicular to the second direction, but it is not limited to this, and the first direction can be not perpendicular to the second direction.

For example, as shown in FIG. 2B, the pattern of the formed electrode strip 110 of the present embodiment further comprises two sub-electrode strip connecting portions 112 extending in the Y direction for electrically connecting the two sub-electrode strips 111 respectively, that is, the embodiment describes an example in which the pattern of the electrode strip 110 is an interdigital electrode, as shown in FIG. 2B, but it is not limited to this. For example, the electrode strip can further comprise two sub-electrode strips extending in the first direction and arranged in the second direction.

For example, as shown in FIG. 2B, the formed plurality of the sub-electrode strips 111 provided by the present embodiment can further comprise a plurality of first sub-electrode strips 1111 and a plurality of second sub-electrode strips 1112 that are alternately disposed. The plurality of first sub-electrode strips 1111 are electrically connected to one sub-electrode strip connecting portion 112 extending in the Y direction, and the plurality of second sub-electrode strips 1112 are electrically connected to the other sub-electrode strip connecting portion 112 extending in the Y direction. In a case that an external bias is applied to the electrode strip 110, the plurality of first sub-electrode strips 1111 have the same electric potential, and the plurality of second sub-electrode strips 1112 have the same electric potential, and a certain potential difference is formed between the first sub-electrode strip 1111 and the second sub-electrode strip 1112 adjacent to each other.

For example, a material forming the electrode strip comprises at least one selected from the group consisting of tungsten, chromium, titanium, platinum, gold, silver, palladium, and iron, etc., and the embodiment comprises but is not limited to this.

For example, the embodiment describes an example in which a semiconductor layer is formed on a side of the electrode strip away from the base substrate, that is, the semiconductor layer can be formed on the electrode strip, and the embodiment comprises but is not limited to this. For example, the semiconductor layer can also be located on a side of the electrode strip close to the base substrate, that is, the semiconductor layer can be formed on the base substrate firstly, and then the electrode strip is formed on the semiconductor layer.

For example, in an example of the embodiment, a method of forming the insulating layer as shown in FIG. 2A, comprises: coating a layer of insulating layer material on the formed electrode strip, and performing one time patterning on the insulating layer material by using a halftone mask process, to form an insulating layer having different thicknesses, that is, the formed insulating layer comprises an thickness increasing portion, which is located on at least one edge of the electrode strip. The embodiment describes an example in which the thickness increasing portion is located only on the at least one edge of the electrode strip, but it is not limited to this.

For example, the insulating layer material can comprise a photoresist material comprising, for example, polyimide or the like, and the embodiment comprises but is not limited to this. For example, a step of directly patterning the insulating layer material using a halftone mask process comprises: exposing the insulating layer material by using a halftone mask, that is, not exposing the insulating layer material on the at least one edge of the electrode strip, and forming partially exposed regions on the insulating layer material on other positions. Then, the insulating layer material subjected to the exposure is further developed to form the insulating layer having different thicknesses, and the formed insulating layer is a barrier layer. The example describes an example in which the insulating layer material is a positive photoresist material, and the example is not limited to this, and for example, the insulating layer material can also be a negative photoresist material. In the example, in a case of forming the insulating layer, the material of the insulating layer is not etched, and the insulating layer having different thicknesses is formed by one time patterning, thereby saving the process and ensuring that the roughness of a surface of the electrode strip covered by the insulating layer (including a side surface of the electrode strip) is not damaged, so that when a high voltage is applied to the electrode strip, electrostatic breakdown does not occur due to poor surface roughness of the electrode strip.

For example, in a case that the material of the insulating layer provided by the present disclosure does not comprise a photoresist material, for example, the insulating layer material is silicon dioxide, silicon nitride, or the like, a photoresist layer can be formed on the insulating layer material, and then the photoresist layer is patterned by a halftone mask process, to form a photoresist pattern having different thicknesses. For example, a thickness of the photoresist layer right above the at least one edge of the electrode strip is greater than a thickness of the photoresist layer on other positions, and then the photoresist layer is ashed to thin the thickness of the photoresist layer right above the at least one edge of the electrode strip, and completely ash the photoresist layer on other positions to remove the photoresist layer. The insulating layer material on other positions which is not covered by the photoresist layer is etched to thin the thickness of the insulating material at the other positions, and then the photoresist layer right above the at least one edge of the electrode strip is stripped to form the desired insulating layer. In the example, the thickness increasing portion of the insulating layer and the portion of the insulating layer other than the thickness increasing portion are formed by one time patterning, so that the process steps can be saved.

For example, the portion of the insulating layer other than the thickness increasing portion is located on the portion between the edges of the electrode strip and in a region of the base substrate where the electrode strip is not provided.

For example, the ratio of the thickness of the formed thickness increasing portion to the thickness of the portion of the insulating layer other than the thickness increasing portion is in the range of 1.5:1 to 3:1, and the embodiment comprises but is not limited to this. Here, the "thickness of the thickness increasing portion" refers to a thickness of the insulating layer extending in a direction perpendicular to the surface or the side surface of the electrode strip, and "the thickness of the portion of the insulating layer other than the thickness increasing portion" refers to a size of the insulating layer in a direction perpendicular to the base substrate.

For example, as shown in FIGS. 2A and 2B, the formed thickness increasing portion 121 is located on two edges of each of the sub-electrode strips 111 extending in the first direction to wrap the edges of each of the sub-electrode strips 111, can also be located on at least one edge of the two sub-electrode strip connecting portions 112 extending in the Y direction for electrically connecting the two sub-electrode strips 111 respectively, to wrap the at least one edge of the sub-electrode strip connecting portion 112, and can also be located on a narrow edge of each sub-electrode strip 111 extending in the Y direction, etc., and this is not limited in the embodiment. The thickness increasing portion provided by the present example can increase the distance between adjacent electrodes, thereby reducing the electric field intensity in the semiconductor layer corresponding to the edge of the electrode strip.

For example, in another example of the embodiment, a method of forming the insulating layer as shown in FIG. 3, comprises: coating a thin layer of insulating layer material (for example, comprising the material such as silicon nitride, etc.) on the formed electrode strip, for example, then etching the insulating layer material by a mask patterning process to form a second insulating layer 123 corresponding to the position of the thickness increasing portion 121 in FIG. 2A, that is, the formed second insulating layer 123 is located on at least one edge of the electrode strip 110, to form the thickness increasing portion 121 together with the subsequently formed first insulating layer 122. Then, another insulating layer material (such as polyimide, etc.) is deposited on the second insulating layer, and the another insulating layer material is processed by a mask patterning process to form an integral first insulating layer covering the electrode strip. The first insulating layer is a barrier layer. The second insulating layer of the present example can increase the distance between adjacent electrodes, thereby reducing the electric field intensity in the semiconductor layer corresponding to the edge of the electrode strip.

For example, the example describes an example in which the second insulating layer is located between the first insulating layer and the electrode strip, but it is not limited to this. For example, the second insulating layer can also be located on a side of the first insulating layer away from the electrode strip. The order of forming the first insulating layer and the second insulating layer also needs to be changed correspondingly, that is, firstly forming the first insulating layer on the electrode strip, and then forming the second insulating layer on the first insulating layer, as long as the second insulating layer can increase the distance between the edge of the electrode strip and the semiconductor layer.

For example, in the present embodiment, a semiconductor layer material is deposited on the formed insulating layer, and a mask patterning process is performed on the semiconductor layer material to form the semiconductor layer.

For example, the semiconductor layer material can be selected from the group consisting of silicon and germanium etc, and the embodiment comprises but is not limited to this. When light with a suitable wavelength is irradiated on the semiconductor layer, the valence band electrons of the semiconductor layer absorb photon energy and transit to the conduction band, and the electron concentration of the conduction band and the hole concentration of the valence band increase to generate photo-generated electron-hole pairs between the conduction band and the valence band, and the generated photo-generated electron-hole pairs are separated into two kinds of carriers, electrons and holes, under the electric field formed between the first electrode strip and the second electrode strip, for example, and the two kinds of carriers are respectively captured by the first electrode strip and the second electrode strip by a motion such as drift or diffusion to form a photo-generated current.

Another embodiment of the present disclosure provides a photoelectric detector comprising the photoelectric detection structure provided by any of the above embodiments. The photoelectric detector provided in the present embodiment can reduce the electric field intensity in the semiconductor photoelectric conversion layer corresponding to the edge of the electrode strip. On the one hand, the dark current is reduced, and on the other hand, the performance of the photoelectric detector can be improved by reducing the width of the electrode strip.

For example, the photoelectric detector can be an ultraviolet detector, a visible light detector, and an infrared detector, to apply to military and civil applications. For example, it can be applied to the field of ray measurement and detection, industrial automatic control, photometric measurement, missile guidance, missile warning, and ultraviolet communication etc., and the embodiment is not limited to this.

The following statements should be noted:

(1) Unless otherwise defined, the same reference sign represents the same meaning in the embodiments of the present disclosure and accompanying drawings (2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

What are described above is the embodiments of the present disclosure only and not limitative to the scope of the present disclosure; any of those skilled in related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. A photoelectric detection structure, comprising:
a base substrate;
an electrode strip on the base substrate;
a semiconductor layer on a side of the base substrate facing the electrode strip;
an insulating layer between the electrode strip and the semiconductor layer, the insulating layer being an integral film layer covering the electrode strip,
wherein the insulating layer comprises a thickness increasing portion, which is located on at least one edge of the electrode strip,
the electrode strip comprises a plurality of first sub-electrode strips and a plurality of second sub-electrode strips extending in a first direction and alternately arranged in a second direction, the plurality of first sub-electrode strips and the plurality of second sub-electrode strips are configured to apply different voltages to form a potential difference between adjacent ones of the plurality of first sub-electrode strips and the plurality of second sub-electrode strips, and the first direction and the second direction cross each other, the thickness increasing portion is located on an edge of at least one of the plurality of first sub-electrode strips and the plurality of second sub-electrode strips facing the other.

2. The photoelectric detection structure according to claim 1, wherein the semiconductor layer is located on a side of the electrode strip away from the base substrate.

3. The photoelectric detection structure according to claim 1, wherein a portion of the insulating layer other than the thickness increasing portion is located on a portion between edges of the electrode strip and in a region of the base substrate where the electrode strip is not provided, and a ratio of a thickness of the thickness increasing portion to a thickness of the portion of the insulating layer other than the thickness increasing portion is in a range of 1.5:1 to 3:1.

4. The photoelectric detection structure according to claim 1, wherein a pattern of the electrode strip comprises an interdigital electrode pattern.

5. The photoelectric detection structure according to a claim 1, wherein a material of the insulating layer comprises a photoresist material.

6. The photoelectric detection structure according to claim 1, wherein the insulating layer comprises a first insulating layer and a second insulating layer, and the second insulating layer is located on the at least one edge of the electrode strip, to form the thickness increasing portion, the first insulating layer is an integral film layer covering the electrode strip, and the second insulating layer is completely in contact with the first insulating layer.

7. A photoelectric detector comprising the photoelectric detection structure according to claim 1.

8. A manufacturing method of a photoelectric detection structure, comprising:
    providing a base substrate; and
    forming an electrode strip, an insulating layer, and a semiconductor layer on a side of the base substrate,
    wherein the insulating layer is formed between the electrode strip and the semiconductor layer, the insulating layer is an integral film layer covering the electrode strip, the insulating layer comprises a thickness increasing portion, which is located on at least one edge of the electrode strip,
    the electrode strip comprises a plurality of first sub-electrode strips and a plurality of second sub-electrode strips extending in a first direction and alternately arranged in a second direction, the plurality of first sub-electrode strips and the plurality of second sub-electrode strips are configured to apply different voltages to form a potential difference between adjacent ones of the plurality of first sub-electrode strips and the plurality of second sub-electrode strips, and the first direction and the second direction cross each other,
    the thickness increasing portion is located on an edge of at least one of the plurality of first sub-electrode strips and the plurality of second sub-electrode strips facing the other.

9. The manufacturing method of the photoelectric detection structure according to claim 8, wherein forming the electrode strip, the insulating layer, and the semiconductor layer on the side of the base substrate comprises:
    forming the electrode strip on the base substrate;
    forming the insulating layer on a side of the electrode strip away from the base substrate; and
    forming the semiconductor layer on a side of the insulating layer away from the electrode strip.

10. The manufacturing method of the photoelectric detection structure according to claim 8, wherein a material of the insulating layer comprises a photoresist material, and the insulating layer is formed by one time patterning with a halftone mask process.

11. The manufacturing method of the photoelectric detection structure according to claim 9, wherein the insulating layer comprises a first insulating layer and a second insulating layer, and forming the insulating layer comprises:
    forming the first insulating layer and the second insulating layer on the electrode strip, wherein the second insulating layer is formed on the at least one edge of the electrode strip to form the thickness increasing portion,
    wherein the first insulating layer is an integral film layer covering the electrode strip, and the second insulating layer is completely in contact with the first insulating layer.

12. A photoelectric detection structure, comprising:
    a base substrate;
    an electrode strip on the base substrate;
    a semiconductor layer on a side of the base substrate facing the electrode strip;
    an insulating layer between the electrode strip and the semiconductor layer, the insulating layer being an integral film layer covering the electrode strip,
    wherein the insulating layer comprises a thickness increasing portion, which is located on at least one edge of the electrode strip,
    the electrode strip comprises a plurality of first sub-electrode strips and a plurality of second sub-electrode strips extending in a first direction and alternately arranged in a second direction, the plurality of first sub-electrode strips and the plurality of second sub-electrode strips are configured to apply different voltages to form a potential difference between adjacent ones of the plurality of first sub-electrode strips and the plurality of second sub-electrode strips, and the first direction and the second direction cross each other,
    a portion of the insulating layer other than the thickness increasing portion is located on a portion between edges of the electrode strip and in a region of the base substrate where the electrode strip is not provided, and a ratio of a thickness of the thickness increasing portion to a thickness of the portion of the insulating layer other than the thickness increasing portion is in a range of 1.5:1 to 3:1.

13. The photoelectric detection structure according to claim 12, wherein the semiconductor layer is located on a side of the electrode strip away from the base substrate.

14. The photoelectric detection structure according to claim 12, wherein the insulating layer comprises a first insulating layer and a second insulating layer, and the second insulating layer is located on the at least one edge of the electrode strip, to form the thickness increasing portion, the first insulating layer is an integral film layer covering the electrode strip, and the second insulating layer is completely in contact with the first insulating layer.

15. The photoelectric detection structure according to claim 12, wherein a pattern of the electrode strip comprises an interdigital electrode pattern.

16. The photoelectric detection structure according to claim 12, wherein a material of the insulating layer comprises a photoresist material.

* * * * *